United States Patent
Li

(10) Patent No.: US 8,279,992 B1
(45) Date of Patent: Oct. 2, 2012

(54) ADAPTIVE BANDWIDTH CLOCK AND DATA RECOVERY CIRCUIT AND METHOD

(75) Inventor: Jinghua Li, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 642 days.

(21) Appl. No.: 12/277,031

(22) Filed: Nov. 24, 2008

(51) Int. Cl.
*H03D 3/24* (2006.01)

(52) U.S. Cl. .................. 375/376; 327/157

(58) Field of Classification Search ........... 375/371, 375/374–376; 327/141, 155–157, 159
See application file for complete search history.

(56) References Cited

U.S. PATENT DOCUMENTS

| | | | |
|---|---|---|---|
| 3,626,298 A | 12/1971 | Anderson et al. | |
| 7,184,511 B2* | 2/2007 | Younis et al. | 375/374 |
| 7,321,612 B2* | 1/2008 | Tonietto et al. | 375/219 |
| 7,532,697 B1* | 5/2009 | Sidiropoulos et al. | 375/376 |
| 7,535,957 B2* | 5/2009 | Ozawa et al. | 375/238 |
| 7,576,614 B2* | 8/2009 | Zachan et al. | 331/16 |
| 7,764,759 B2* | 7/2010 | Gupta et al. | 375/355 |
| 2006/0267644 A1 | 11/2006 | Youssoufian et al. | |
| 2007/0176694 A1* | 8/2007 | Rhee et al. | 331/16 |
| 2009/0273407 A1* | 11/2009 | Kim | 331/183 |
| 2010/0203848 A1* | 8/2010 | Darabi | 455/86 |

FOREIGN PATENT DOCUMENTS

JP 2005-210629 A * 8/2005

OTHER PUBLICATIONS

Machine Translation for JP-2005-210629, Jun. 9, 2011.*
Hogge, C. R., "A Self Correcting Clock Recovery Circuit," Journal of Lightwave Technology, Dec. 1985, pp. 1312-1314, vol. 3, No. 6.
Alexander, J.D.H., "Clock Recovery From Random Binary Signals," Electronics Letters, Oct. 1975, pp. 541-542, vol. 11, No. 22.
Kromer et al., "A 25-Gb/s CDR in 90-nm CMOS for High-Density Interconnects," IEEE Journal of Solid-State Circuits, Dec. 2006, pp. 2921-2929, vol. 41, No. 12.
Jayant, N. S., "Digital Coding of Speech Waveforms: PCM, DPCM, and DM Quantizers," Proceedings of the IEEE, May 1974, pp. 611-633, vol. 62, No. 5.
Riezenman, M. J., "Optical Nets Brace for Even Heavier Traffic," IEEE Spectrum, Jan. 2001, pp. 44-46.
"Fibre Channel—Methodologies for Jitter and Signal Quality Specification-MJSQ, (Working Draft)," May 21, 2004, T11.2/Project 1316-DT/Rev 13.2, pp. 1-239.
"Synchronous Optical Network (SONET) Transport Systems: Common Generic Criteria," Telecordia Technologies Generic Requirements, GR-253-CORE, Dec. 2005, pp. 1/1-8/52 and A/1-D/26, Issue 4.

(Continued)

*Primary Examiner* — Jean B Corrielus
(74) *Attorney, Agent, or Firm* — Zilka-Kotab, PC

(57) ABSTRACT

An adaptive bandwidth clock and data recovery circuit and method are provided. The adaptive bandwidth clock and data recovery circuit includes a voltage controlled oscillator for outputting a phase of a clock. In addition, a phase detector is included for determining a phase difference between received data and the clock. Further, a charge pump is included for outputting a current as a function of the phase difference, the current utilized for generating a control voltage provided to the voltage controlled oscillator. Still yet, an adaptive bandwidth control is included for providing the voltage controlled oscillator with an adaptive bandwidth based on the phase difference.

18 Claims, 10 Drawing Sheets

OTHER PUBLICATIONS

Henrickson et al., "Low-Power Fully Integrated 10-Gb/s SONET/SDH Transceiver in 0.13-pm CMOS," IEEE Journal of Solid-State Circuits, Oct. 2003, pp. 1595-1601, vol. 38, No. 10.

Cong et al., "A 10-Gb/s 16:1 Multiplexer and 10-GHz Clock Synthesizer in 0.25-μm SiGe BiCMOS," IEEE Journal of Solid-State Circuits, Dec. 2001, pp. 1946-1953, vol. 36, No. 12.

Greshishchev et al., "A Fully Integrated SiGe Receiver IC for 10-Gb/s Data Rate," IEEE Journal of Solid-State Circuits, Dec. 2000, pp. 1949-1957, vol. 35, No. 12.

Meghelli et al., "SiGe BiCMOS 3.3V Clock and Data Recovery Circuits for 10Gb/s Serial Transmission Systems," IEEE International Solid-State Circuits Conference, Feb. 2000, pp. 56-57.

Hauenschild et al., "A Plastic Packaged 10 Gb/s BiCMOS Clock and Data Recovering 1:4-Demultiplexer with External VCO," IEEE Journal of Solid-State Circuits, Dec. 1996, pp. 2056-2059, vol. 31, No. 12.

Walker et al., "A 10Gb/s Si-Bipolar TX/RX Chipset for Computer Data Transmission," IEEE, 1998, pp. 19.1/1-19.1/11.

Savoj et al., "A 10Gb/s CMOS Clock and Data Recovery Circuit with Frequency Detection," IEEE International Solid-State Circuits Conference, 2001, pp. 78-79 and 434.

Cao et al., "OC-192 Receiver in Standard 0.18μm CMOS," IEEE International Solid-State Circuits Conference, 2002, pp. 250-251.

Rogers et al., "A 10Gb/s CDR/DEMUX with LC Delay Line VCO in 0.18μm CMOS," IEEE International Solid-State Circuits Conference, 2002, pp. 254-255.

Sidiropoulos et al., "An 800mW 10Gb Ethernet Transceiver in 0.13μm CMOS," IEEE International Solid-State Circuits Conference, 2004, pp. 168-169.

Lee et al., "A 155-MHz Clock Recovery Delay—and Phase-Locked Loop," IEEE Journal of Solid-State Circuits, Dec. 1992, pp. 1736-1746, vol. 27, No. 12.

Lai et al., "A Monolithic 622Mb/s Clock Extraction Data Retiming Circuit," IEEE International Solid-State Circuits Conference, Feb. 1991, pp. 144-145 and 306.

Greshishchev et al., "SiGe Clock and Data Recovery IC with Linear-Type PLL for 10-Gb/s SONET Application," IEEE Journal Solid-State Circuits, Sep. 2000, pp. 1353-1359, vol. 35, No. 9.

Lee et al., "Analysis and Modeling of Bang-Bang Clock and Data Recovery Circuits," IEEE Journal of Solid-State Circuits, Sep. 2004, pp. 1571-1580, vol. 39, No. 9.

Pottbacker et al., "An 8 GHz Silicon Bipolar Clock-Recovery and Data-Regenerator IC," IEEE Journal of Solid-State Circuits, Dec. 1994, pp. 1572-1576, vol. 29, No. 12.

Rhee, W., "Design of High-Performance CMOS Charge Pumps in Phase-Locked Loops," Proceedings of the IEEE International Symposium on Circuits and Systems, Jul. 1999, pp. 545-548, vol. 2.

Valero Lopez, A. Y., "Design of Frequency Synthesizers for Short Range Wireless Transceivers," Dissertation, Texas A&M University, May 2004, pp. 1-235.

Johnson et al., "A Variable Delay Line PLL for CPU-Coprocessor Synchronization," IEEE Journal of Solid-State Circuits, Oct. 1988, pp. 1218-1223, vol. 23, No. 5.

Young et al., "A PLL Clock Generaotr with 5 to 110 MHz of Lock Range for Microprocessors," IEEE Journal of Solid-State Circuits, Nov. 1992, pp. 1599-1607, vol. 27, No. 11.

Lin, L., "Design Techniques for High Performance Integrated Frequency Synthesizers for Multi-Standard Wireless Communication Applications," Dissertation, University of California, Berkeley, 2000, pp. 1-100.

Novof et al., "Fully Integrated CMOS Phase-Locked Loop with 15 to 240 MHz Locking Range and ±50 ps Jitter," IEEE Journal of Solid-State Circuits, Nov. 1995, pp. 1259-1266, vol. 30, No. 11.

Werker et al., "A 10-GB/s SONET-Compliant CMOS Transceiver With Low Crosstalk and Intrinsic Jitter," IEEE Journal of Solid-State Circuits, Dec. 2004, pp. 2349-2358, vol. 39, No. 12.

Hajimiri et al., "Design Issues in CMOS Differential LC Oscillators," IEEE Journal of Solid-State Circuits, May 1999, pp. 717-724, vol. 34, No. 5.

Rael et al., "Physical Processes of Phase Noise in Differential LC Oscillators," IEEE Custom Integrated Circuits Conference, May 2000, pp. 569-572.

Hegazi et al., "A Filtering Technique to Lower LC Oscillator Phase Noise," IEEE Journal of Solid-State Circuits, Dec. 2001, pp. 1921-1930, vol. 36, No. 12.

Darabi et al., "Noise in RF-CMOS Mixers: A Simple Physical Model," IEEE Transactions on Solid State Circuits, Jan. 2000, pp. 15-25, vol. 35, No. 1.

Rofougaran et al., "A 900 MHz CMOS LC-Oscillator with Quadrature Outputs," To be presented at the 1996 Int'l Solid-State Circuits Conference, Feb. 8-10, 1996, pp. 1-10.

Liu, T.-P., "1.5 V 10-12.5 GHz Integrated CMOS Oscillators," Symposium on VLSI Circuits Digest of Technical Papers, 1999, pp. 55-56.

Lo et al., "2-V 900 MHz Quadrature Coupled LC Oscillators with Improved Amplitude and Phase Matchings," Proceedings of the 1999 IEEE International Symposium on Circuits and Systems, ISCAS '99, May 30-Jun. 2, 1999, pp. 585-588, vol. 2.

Meghelli et al., "A 0.18μm SiGe BiCMOS Receiver and Transmitter Chipset for SONET OC-768 Transmission Systems," IEEE International Solid-State Circuits Conference, Sep. 2003, pp. 1-10.

Craninckx et al., "A Fully Integrated CMOS DCS-1800 Frequency Synthesizer," IEEE Journal of Solid-State Circuits, Dec. 1998, pp. 2054-2065, vol. 33, No. 12.

Maxim et al., "A Low-Jitter 125-1250-MHz Process-Independent and Ripple-Poleless 0.18-μm CMOS PLL Based on a Sample-Reset Loop Filter," IEEE Journal of Solid-State Circuits, Nov. 2001, pp. 1673-1683, vol. 36, No. 11.

Walker et al., "A Two-Chip 1.5-GBd Serial Link Interface," IEEE Journal of Solid-State Circuits, Dec. 1992, pp. 1805-1811, vol. 27, No. 12.

Sackinger et al., "A 3-GHz 32-dB COMOS Limiting Amplifier for SONET OC-48 Receivers," IEEE Journal of Solid-State Circuits, Dec. 2000, pp. 1884-1888, vol. 35, No. 12.

Cherry et al., "The Design of Wide-Band Transistor Feedback Amplifiers," Proceedings IEE, Feb. 1963, pp. 375-389, vol. 110, No. 2.

Hajimiri et al., "Jitter and Phase Noise in Ring Oscillators," IEEE Journal of Solid-State Circuits, Jun. 1999, pp. 790-804, vol. 34, No. 6.

Herzel et al., "A Study of Oscillator Jitter Due to Supply and Substrate Noise," IEEE Transactions on Circuits and Systems-II: Analog and Digital Signal Processing, Jan. 1999, pp. 56-62, vol. 46, No. 1.

Takauchi et al., "A CMOS Multichannel 10-Gb/s Transceiver," IEEE Journal of Solid-State Circuits, Dec. 2003, pp. 2094-2100, vol. 38, No. 12.

Walker, R. C., "Designing Bang-Bang PLLs for Clock and Data Recovery in Serial Data Transmission Systems," Transition, pp. 34-45.

Stojanovic et al., "Modeling and Analysis of High-Speed Links," Proceedings of the IEEE 2003 Custom Integrated Circuits Conference, Sep. 21-24, 2003, pp. 589-594.

Dalt, N. D., "A Design-Oriented Study of the Nonlinear Dynamics of Digital Bang-Bang PLLs," IEEE Transactions on Circuits and Systems-I: Regular Papers, Jan. 2005, pp. 21-31, vol. 52, No. 1.

Gelb et al., "Multiple-Input Describing Functions and Nonlinear System Design," McGraw Hill Book Company, 1968, pp. 1-655.

* cited by examiner

ADAPTIVE BANDWIDTH CLOCK AND DATA
RECOVERY CIRCUIT AND METHOD

FIELD OF THE INVENTION

The present invention relates to clock data recovery circuits, and more particularly to bandwidth of clock data recovery circuits.

BACKGROUND

Traditionally, clock and data recovery (CDR) has been utilized for extracting a clock from received data which is often distorted by transport media, and using such clock to re-time the data from the received data. Oftentimes, CDR is used in chip-to-chip interface applications. However, traditional implementations of clock data recovery have generally exhibited various limitations.

For example, CDR uses phase detection for detecting a phase (e.g. phase error) associated with the received data. Unfortunately, performing such phase lock has conventionally been limited to use of a fixed charge pump current setting associated with a passive or digital loop filter in the CDR, such that the phase is adjusted utilizing a constant charge pump current together until a phase lock of the data is performed. As a result, when tracking high frequency sinusoidal jitter, the CDR employing the fixed charge pump current control setting experiences a slew-rate limited tracking process and the jitter tolerance performance is degraded due to a limited equivalent bandwidth. Similar problems do not only exist with respect to charge pump based CDR or phase-locked loop (PLL), but also exist with respect to phase interpolator based CDR which pick or adjusts its phase from many interpolated clock phases.

There is thus a need for addressing these and/or other issues associated with the prior art.

SUMMARY

An adaptive bandwidth clock and data recovery circuit and method are provided. The adaptive bandwidth clock and data recovery circuit includes a voltage controlled oscillator for outputting a phase of a clock. In addition, a phase detector is included for determining a phase difference between received data and the clock. Further, a charge pump is included for outputting a current as a function of the phase difference, the current utilized for generating a control voltage provided to the voltage controlled oscillator. Still yet, an adaptive bandwidth control is included for providing the voltage controlled oscillator with an adaptive bandwidth based on the phase difference (e.g. a history of the phase difference).

DETAILED DESCRIPTION

Figure 1:
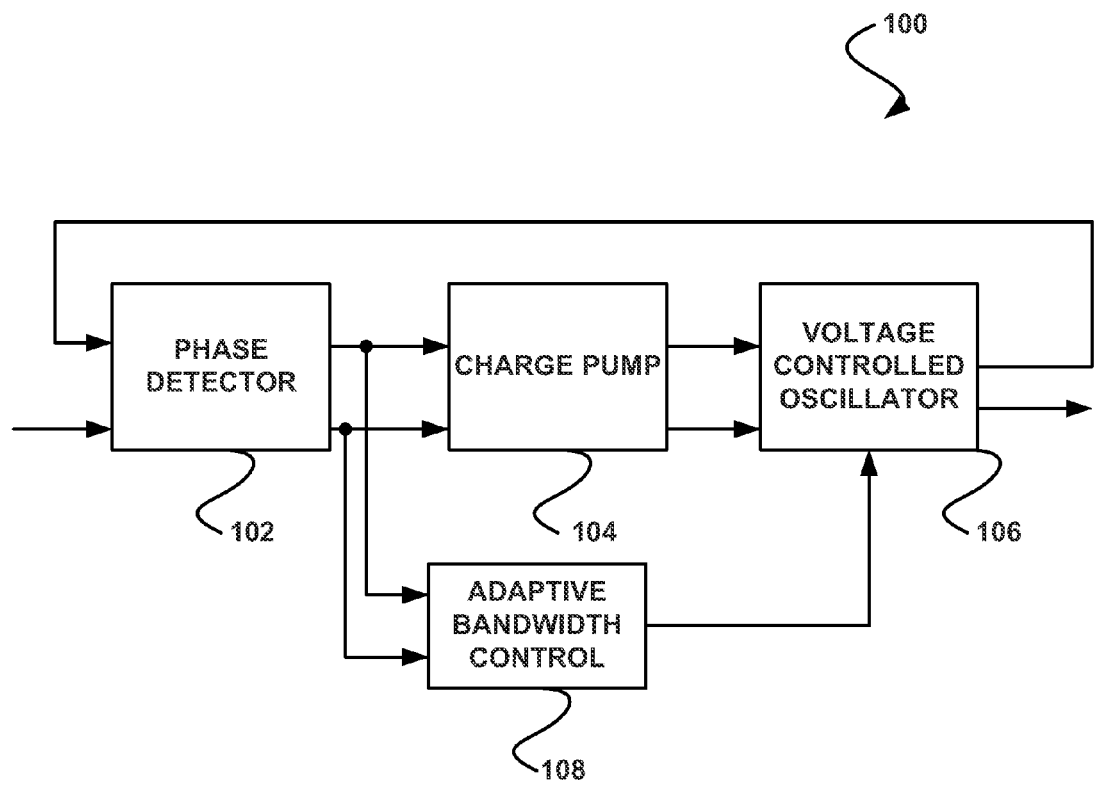
FIG. 1 shows an adaptive bandwidth clock and data recovery circuit, in accordance with one embodiment.

FIG. 1 shows an adaptive bandwidth clock and data recovery (CDR) circuit 100, in accordance with one embodiment. In various embodiments, the adaptive bandwidth CDR circuit 100 may be implemented in the context of a charge pump based CDR or phase-locked loop (PLL), a phase interpolator based CDR which pick or adjusts its phase from many interpolated clock phases, etc. As shown, a phase detector 102 is included. With respect to the present description, the phase detector 102 may include any logic capable of determining a phase difference between received data and a clock (e.g. generated by a voltage controlled oscillator 106, generated by a phase interpolator not shown in the FIG. 1, etc.).

In one embodiment, the received data may include a digital data stream. For example, the received data may include a high-speed serial data stream, such as a raw stream of data from a magnetic head of a disk drive. Of course, however, the received data may include data received from any desired device. As an option, the received data may include data received over a network (e.g. from a remote device).

Additionally, the phase difference determined by the phase detector 102 may include any difference in phases (e.g. frequency difference can also be converted to phase difference, etc.) employed by the received data and the clock. In one embodiment, the clock may be the recovered or re-timed clock from a data input. Just by way of example, the received data may be associated with a phase and the generated clock is possibly associated with a different phase. Thus, the phase difference may include the difference between the data phase and the clock phase. To this end, the phase difference may indicate a phase error between the received data and the clock.

In one embodiment, the phase of the received data may include a nominal frequency. In a further embodiment, the phase of the received data may be offset by an offset frequency. In another embodiment, the phase of the received data may include a sum of phase jitter associated with the received data and the phase shift caused by the offset frequency.

In yet another embodiment, the phase of the clock may include a phase output by a voltage controlled oscillator 106 (e.g. a ring oscillator, etc.). For example, as shown, the phase detector 102 may receive the phase of the clock from the voltage controlled oscillator 106 for determining the phase difference. As an option, the phase of the clock output by the voltage controlled oscillator 106 may include an adjusted phase (e.g. re-timed clock) of previously received data. Various techniques for generating an adjusted phase of data capable of being output by the voltage controlled oscillator 106 are described below in more detail with respect to adjusting a phase of the received data.

Furthermore, a charge pump 104 is included for outputting a current as a function of the phase difference, where the current is utilized for generating a control voltage provided to the voltage controlled oscillator 106. Accordingly, the charge pump 104 may include any module capable of outputting a current as a function of the phase difference determined by the phase detector 102. In this way, the phase difference determined by the phase detector 102 may optionally control operation of the charge pump 104.

For example, the charge pump 104 may receive an indication of the phase difference from the phase detector 102, such that the charge pump 104 may convert such phase difference into an associated current. Thus, the current may be proportional to the phase difference. In one embodiment, the charge pump 104 may output (e.g. pump in/out) the current to a loop filter following the charge pump (not shown in FIG. 1) to generate the control voltage for the voltage controlled oscillator 106. In another embodiment, the charge pump 104 may provide the current to another module (e.g. such as a filtering capacitor, by integrating the current on such filtering capacitor, etc.), which may in turn generate the control voltage and provide such control voltage to the voltage controlled oscillator 106.

To this end, the voltage controlled oscillator 106 may receive the control voltage and may be controlled by such control voltage. In one embodiment, the control voltage may, at least in part, control the phase output of the voltage controlled oscillator. 106. Thus, based on the difference of the phase of the received data and the phase of the clock (as output by the voltage controlled oscillator 106), the voltage controlled oscillator 106 may output a new phase for the received data.

Moreover, an adaptive bandwidth control 108 is included for providing the voltage controlled oscillator 106 with an adaptive bandwidth adjustment based on the phase difference (e.g. a history of the phase difference). As an option, the adaptive bandwidth control 108 may include a bang-bang control. As another option, the adaptive bandwidth control 108 may include an integration control.

Of course, however, the adaptive bandwidth control 108 may optionally include any module capable of outputting an adaptive bandwidth to the voltage controlled oscillator 106, where such adaptive bandwidth is based on the history of the phase difference determined by the phase detector 102. Accordingly, the adaptive bandwidth control 108 may optionally receive an indication of the phase difference from the phase detector 102, as shown, for determining the adaptive bandwidth based thereon.

In one embodiment, the adaptive bandwidth may include an adjusted bandwidth (e.g. phase) of the received data. Thus, the adaptive bandwidth may be provided by adjusting the bandwidth associated with the received data. As an option, bandwidth may be adjusted by adjusting a step size of the bandwidth. For example, the step size may be adjusted based on the phase difference (e.g. as a function of the phase difference, etc.).

In another embodiment, the adaptive bandwidth control 108 may utilize a state machine for providing the adaptive bandwidth. For example, the state machine may adjust the bandwidth based on a predefined adjustment associated with the history (or the state) of the phase difference. In yet another embodiment, the adaptive bandwidth control 108 may provide the adaptive bandwidth for minimizing jitter associated with the received data.

As an option, the voltage controlled oscillator 106 may utilize the adjusted bandwidth and the control voltage to output a phase of the received data to the phase detector 102. In turn, the phase detector 102 may determine a phase difference between the received data and subsequently received data (e.g. other data received after the received data). In this way, a bandwidth of the clock and data recovery circuit 100 may be continuously adjusted (e.g. based on a phase difference determined as a response to newly received data, and thus based on a phase variation of data input to the clock and data recovery circuit 100).

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
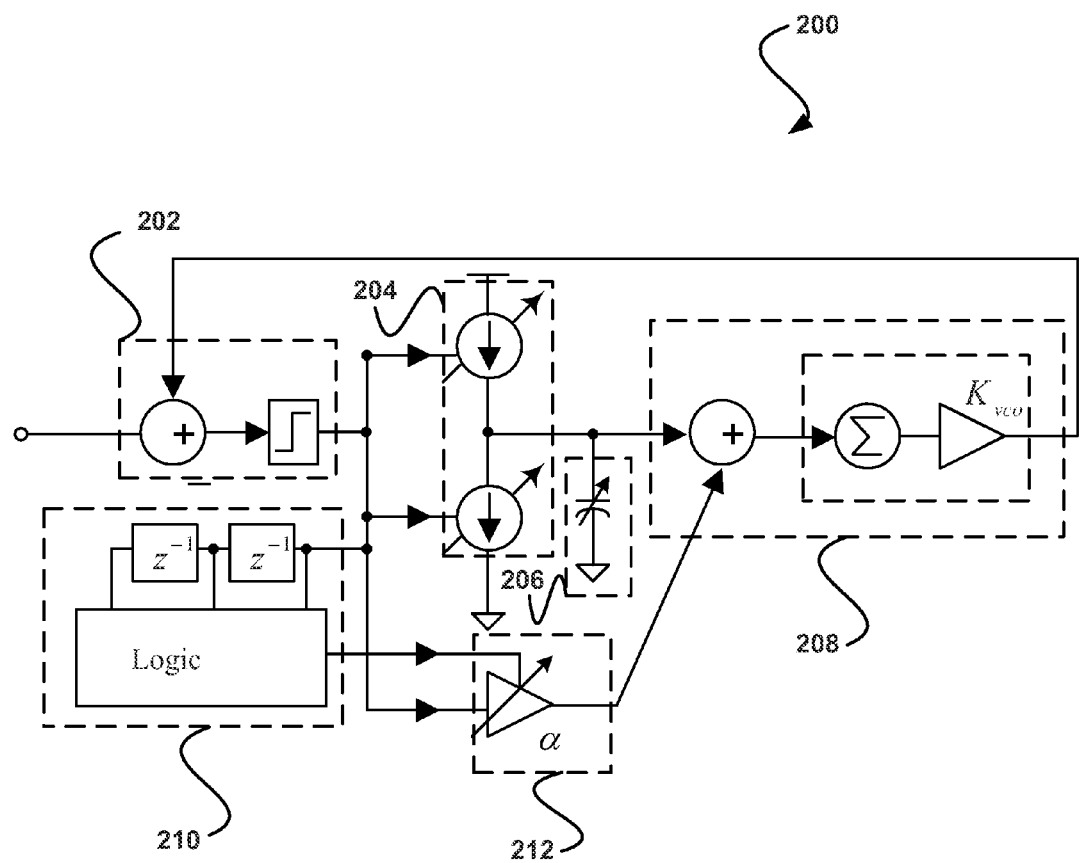
FIG. 2 shows an adaptive bandwidth clock and data recovery circuit, in accordance with another embodiment.

FIG. 2 shows an adaptive bandwidth clock and data recovery circuit 200, in accordance with another embodiment. As an option, the adaptive bandwidth clock and data recovery circuit 200 may be implemented in the context of the functionality and architecture of FIG. 1. Of course, however, the adaptive bandwidth clock and data recovery circuit 200 may be implemented in any desired environment. It should also be noted that the aforementioned definitions may apply during the present description.

As shown, a phase detector 202 is coupled to a charge pump 204. The phase detector 202 receives input data and determines a phase difference between the input data and a re-timed clock. The phase of the re-timed clock may include an adjusted phase for the clock, for previously received data, etc. as an option. As another option, the phase of the re-timed clock may be output from a voltage controlled oscillator 208 and received by the phase detector 202 for determining the phase difference.

In one embodiment, the phase detector 202 may include a binary phase comparator. In another embodiment, the phase detector 202 (e.g. the binary phase comparator of the phase detector 202) may compare the phase of the received data and the phase of the re-timed clock. In yet another embodiment, the phase detector 202 may output a stream of +1 (e.g. representing a phase lead) or −1 (representing a phase lag) based on the comparison. Thus, the phase detector 202 may digitize the phase difference at a clock rate or sub-harmonic clock rate received by the voltage controlled oscillator 208.

The charge pump 204 receives an indication of the phase difference determined by the phase detector 202 (e.g. via the output stream) and outputs a current based on the phase difference. In response to receipt of the phase difference, the charge pump 204 outputs the current to a filtering capacitor 206. The filtering capacitor 206 may thus convert the received current into a control voltage, which is provided to the voltage controlled oscillator 208.

As an option, the charge pump 204 and filtering capacitor 206 may provide an integration path to the voltage controlled oscillator 208. Accordingly, the voltage controlled oscillator 208 may optionally be controlled by the control voltage, which is generated as a function of the phase difference determined by the phase detector 202.

As also shown, the phase detector 202 is coupled to an adaptive bandwidth control 210. The adaptive bandwidth control 210 includes logic for adaptively adjusting a bandwidth of the adaptive bandwidth clock and data recovery circuit 200. For example, the phase difference may be adaptively adjusted via the adaptive bandwidth control 210.

In one embodiment, the adaptive bandwidth control 210 may utilize a state machine for adaptively adjusting the bandwidth. The state machine may receive the phase difference from the phase detector 202 as input, and may output an adjusted bandwidth predetermined to be associated with the phase difference. In this way, the bandwidth may be adaptively adjusted as a function of the phase difference determined by the phase detector 202.

Furthermore, the adaptive bandwidth control 210 is coupled to an amplifier 212 (e.g. a variable gain amplifier using source degeneration, etc.). As an option, the amplifier 212 may adaptively adjust the gain and the bandwidth. For example, the adaptive bandwidth control 210 may determine the extent to which the bandwidth is to be adjusted, and may indicate such extent to the amplifier 212. To this end, the amplifier 212 may optionally amplify or de-amplify the bandwidth based on the indication output from the adaptive bandwidth control 210.

In this way, the adaptive bandwidth control 210 may provide the adaptive bandwidth by controlling the amplifier 212 to adjust the amplifier gain as instructed by the adaptive bandwidth control 210. Of course, the amplifier 212 may amplify the bandwidth in any desired manner.

Further, the adaptively adjusted gain is provided to the voltage controlled oscillator 208, such that the voltage controlled oscillator 208 may output a new phase for the received data, based on the adaptively adjusted gain. For example, the voltage controlled oscillator 208 may utilize the control voltage received from the filtering capacitor 206 to adjust its instantaneous frequency, and thus output the new phase for the received data to the phase detector 202. In response to receipt of the new phase, the phase detector 202 may compare such new phase to next data that is received for determining a phase difference therebetween. The bandwidth of the clock and data recovery circuit 200 may accordingly be adjusted based on each determined phase difference.

Figure 3:
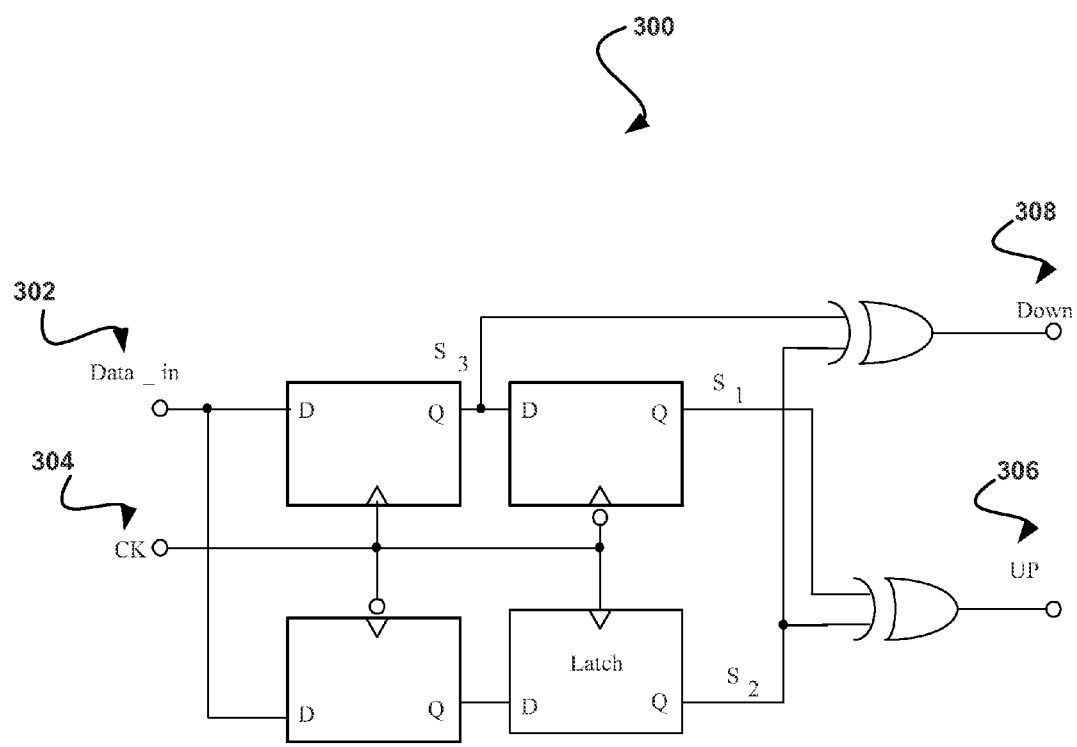
FIG. 3 shows a binary phase detector, in accordance with yet another embodiment.

FIG. 3 shows a binary phase detector 300, in accordance with yet another embodiment. As an option, the phase detector 300 may be implemented in the context of the functionality and architecture of FIGS. 1 and/or 2. For example, the phase detector 300 may be implemented in the context of the phase detector 202 of FIG. 2. Of course, however, the phase detector 300 may be implemented in any desired environment. Again, it should be noted that the aforementioned definitions may apply during the present description.

As shown, data 302 and a clock signal 304 are received as input. In one embodiment, the data 302 may be received from a source external to a clock and data recovery circuit that includes the phase detector 300 (e.g. such as from a network, etc.). In another embodiment, the clock signal 304 may be received from a voltage controlled oscillator of the clock and data recovery circuit. For example, the clock signal 304 may represent a phase (e.g. an adjusted phase) of previously received data.

The phase detector 300 compares a phase of the data 302 and the clock signal 304 and outputs an up signal 306 and a down signal 308 representative of a phase difference between the data 302 and the clock signal 304. In this way, the phase detector 300 may determine a phase difference between the data 302 and the clock signal 304.

Figure 4:
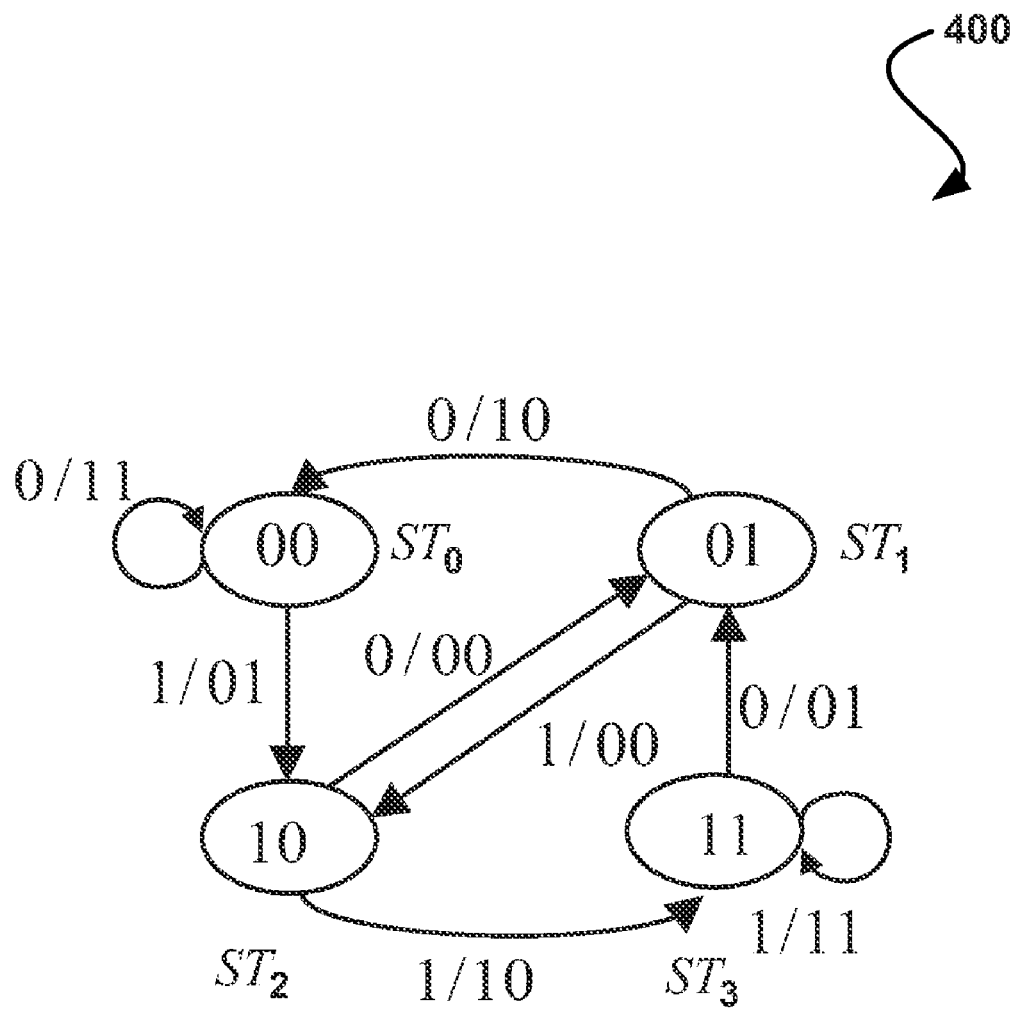
FIG. 4 shows a state diagram of an adaptive bandwidth control, in accordance with still yet another embodiment.

FIG. 4 shows a state diagram 400 of an adaptive bandwidth control, in accordance with still yet another embodiment. As an option, the state diagram 400 may be implemented in the context of the functionality and architecture of FIGS. 1-3. For example, the state diagram 400 may be implemented in the context of the adaptive bandwidth control 210 of FIG. 2. Of course, however, the state diagram 400 may be implemented in any desired environment. Again, it should be noted that the aforementioned definitions may apply during the present description.

In the context of the state diagram 400, an associated state machine (e.g. Mealy state machine) implementing the state diagram 400 may be in one of four possible states (i.e. "00", "01", "10", and "11"). Of course, the state machine may be in any other desired number of states, and thus the state diagram 400 may include any desired number of states associated with such state machine.

Also in the context of the state diagram 400, a bit input to the state machine is represented by the single value to the left of the "/" symbol. Further, two bits output by the state machine are each represented by one of the two values to the right of the "/" symbol respectively.

The bit input to the state machine may include the output of a phase detector of a clock and data recovery circuit employing the state machine. For example, the bit input to the state machine may indicate a phase difference between received data and data re-timed clock. The first of the two bits output by the state machine may indicate a first clock cycle delay (e.g. one clock cycle delay) associated with the bit input to the state machine. The second of the two bits output by the state machine may indicate a second clock cycle delay (e.g. a two clock cycle delay) associated with the bit input to the state machine. The delays may be implemented utilizing regular D-type flip-flops, as an option.

To this end, the state machine may optionally transition between states based on an input and output thereof. Based on the state of the state machine, a bandwidth of the data and recovery circuit may be adjusted. For example, a step size of the bandwidth may be adjusted according to a step size predetermined to be associated with the state of the state machine.

Table 1 illustrates one equation representing a step size of the bandwidth. With respect to the equation shown in Table 1, $\oplus$ denotes XOR logic function. It should be noted that such equation is set forth for illustrative purposes only, and thus should not be construed as limiting in any manner.

TABLE 1

$$\begin{cases} \text{Step\_size}[1] = \overline{B(n) \oplus B(n-1)}; \\ \text{Step\_size}[0] = \overline{B(n-1) \oplus B(n-2)} \end{cases}$$

Furthermore, Table 2 illustrates step size adjustments that may be performed on the bandwidth (e.g. for increasing the bandwidth) of the clock and data recovery circuit based on predetermined input and output values of the state machine. The algorithm is based on a classical delta modulation scheme in audio compression, which is used in clock and data recovery instead. However, is should be noted that the step size adjustment is not limited to this implementation only. In Table 2, B(n) represents the input to the state machine, B(n−1) represents the one clock cycle delay of B(n), and B(n−2) represents a two clock cycle delay of B(n). Also, a 1=0.75, a 2=0.5, a 3=1.5, a 4=2.0. Again, it should be noted that the step size adjustments are set forth for illustrative purposes only, and thus should not be construed as limiting in any manner.

TABLE 2

| B(n) | B(n-1) | B(n-2) | State | Step size |
|---|---|---|---|---|
| −1 | 1 | −1 | Alternate polarity | a 1 |
| 1 | −1 | 1 | Alternate polarity | a 1 |
| −1 | 1 | 1 | Sign reversal | a 2 |
| 1 | −1 | −1 | Sign reversal | a 2 |
| −1 | −1 | 1 | Semi-overload | a 3 |
| 1 | 1 | −1 | Semi-overload | a 3 |
| −1 | −1 | −1 | Overload | a 4 |
| 1 | 1 | 1 | Overload | a 4 |

Figure 5:
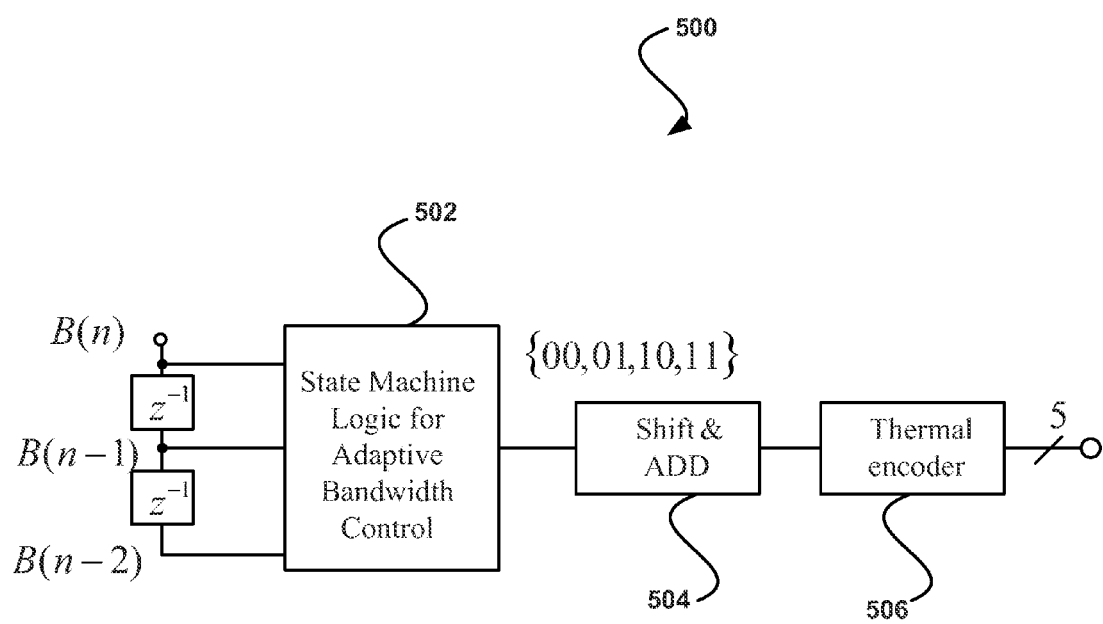
FIG. 5 shows an adaptive bandwidth control, in accordance with another embodiment.

FIG. 5 shows adaptive bandwidth control logic 500, in accordance with another embodiment. As an option, the adaptive bandwidth control logic 500 may be implemented in the context of the functionality and architecture of FIGS. 1-4. For example, the adaptive bandwidth control logic 500 may be implemented in the context of the adaptive bandwidth control 210 of FIG. 2. Of course, however, the adaptive bandwidth control logic 500 may be implemented in any desired environment. Yet again, it should be noted that the aforementioned definitions may apply during the present description.

As shown, the adaptive bandwidth control logic 500 receives an indication of a phase difference between received data and a re-timed clock. For example, the adaptive bandwidth control logic 500 may receive the indication of the phase difference from a phase detector of a clock and data recovery circuit in which the adaptive bandwidth control logic 500 is implemented. As shown, the indication of the phase difference is denoted by B(n).

The adaptive bandwidth control logic 500 also identifies a one clock cycle delay of the phase difference (denoted by B(n−1)) and a two clock cycle delay of the phase difference (denoted by B(n−2)). A state machine 502 of the adaptive bandwidth control logic 500 receives values indicating the phase difference, the one clock cycle delay and the two clock cycle delay and utilizes such values for changing to an associated state. For example, the state may be predetermined to be associated with the combination of the values.

Once the state machine changes to the state associated with the values, a shift and add module 504 identifies the state and determines a step size for which a bandwidth of the clock and data recovery circuit is to be adjusted. The step size may be predetermined for the state, for example. Furthermore, the step size is encoded utilizing a thermal encoder 506. The encoded step size may optionally be provided to an amplifier for adjusting the bandwidth based on such encoded step size.

In one exemplary embodiment, the phase difference may be represented as "00", the one clock cycle delay may be represented as "01", and the two clock cycle delay may be represented as "10". Further, the state associated with such exemplary values may be represented by "11". Thus, the step size associated with the "11" state may be identified by the shift and add module 504, may be encoded by the thermal encoder 506 and may be provided to an encoded utilizing a thermal encoder 506. The encoded step size may optionally be provided to an amplifier for adjusting the bandwidth based on the encoded step size.

Figure 6:
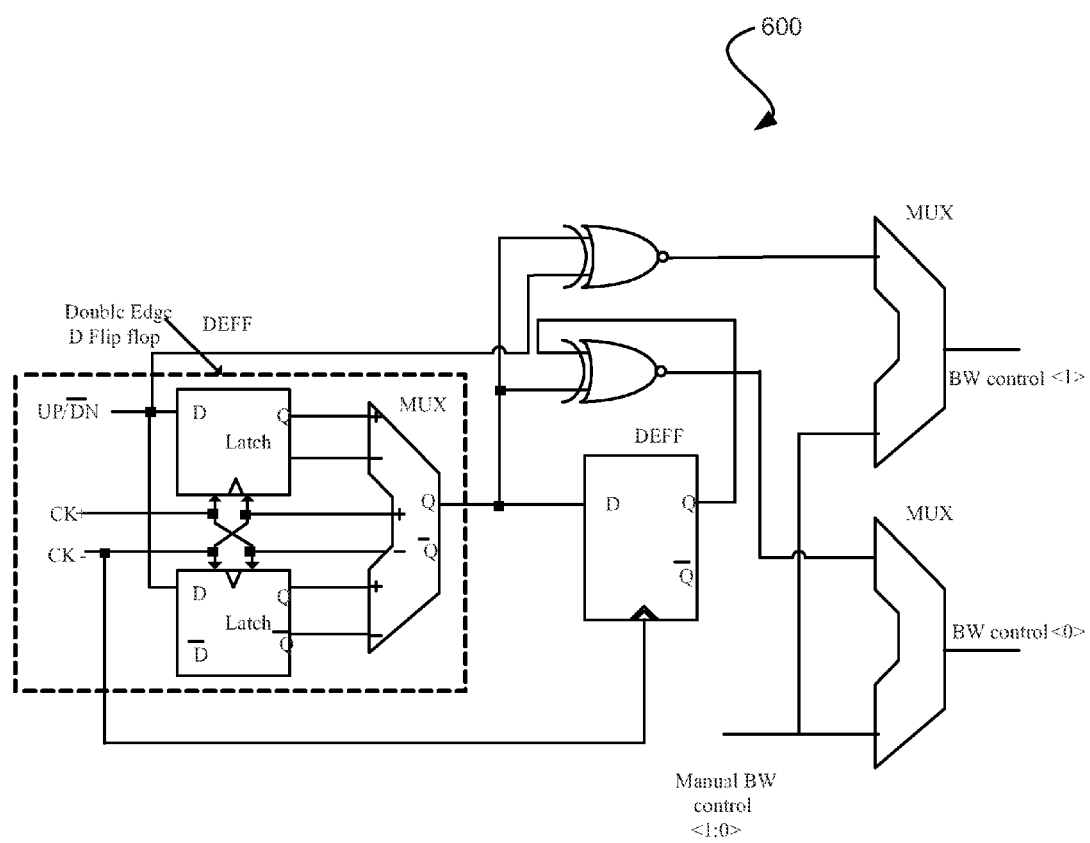
FIG. 6 shows adaptive bandwidth control logic, in accordance with yet another embodiment.

FIG. 6 shows adaptive bandwidth control logic 600, in accordance with yet another embodiment. As an option, the adaptive bandwidth control logic 600 may be implemented in the context of the functionality and architecture of FIGS. 1-5. For example, the adaptive bandwidth control logic 600 may be implemented in the context of the adaptive bandwidth control 210 of FIG. 2. Of course, however, the adaptive bandwidth control logic 600 may be implemented in any desired environment. Yet again, it should be noted that the aforementioned definitions may apply during the present description.

As shown, the adaptive bandwidth control logic 600 may employ a state machine for determining a step size adjustment for a bandwidth of an associated clock and data recovery circuit. The state of the state machine may optionally be determined based on the state diagram shown in FIG. 4, just by way of example.

The state machine utilizes two double-edge-triggered-flip-flops and two exclusive nor (EX-NOR) gates. Two multiplexors (MUXs) at the output are included to provide bandwidth control. The 2-bit binary outputs may drive a programmable gain element capable of adjusting a bandwidth the clock and data recovery circuit.

Figure 7:
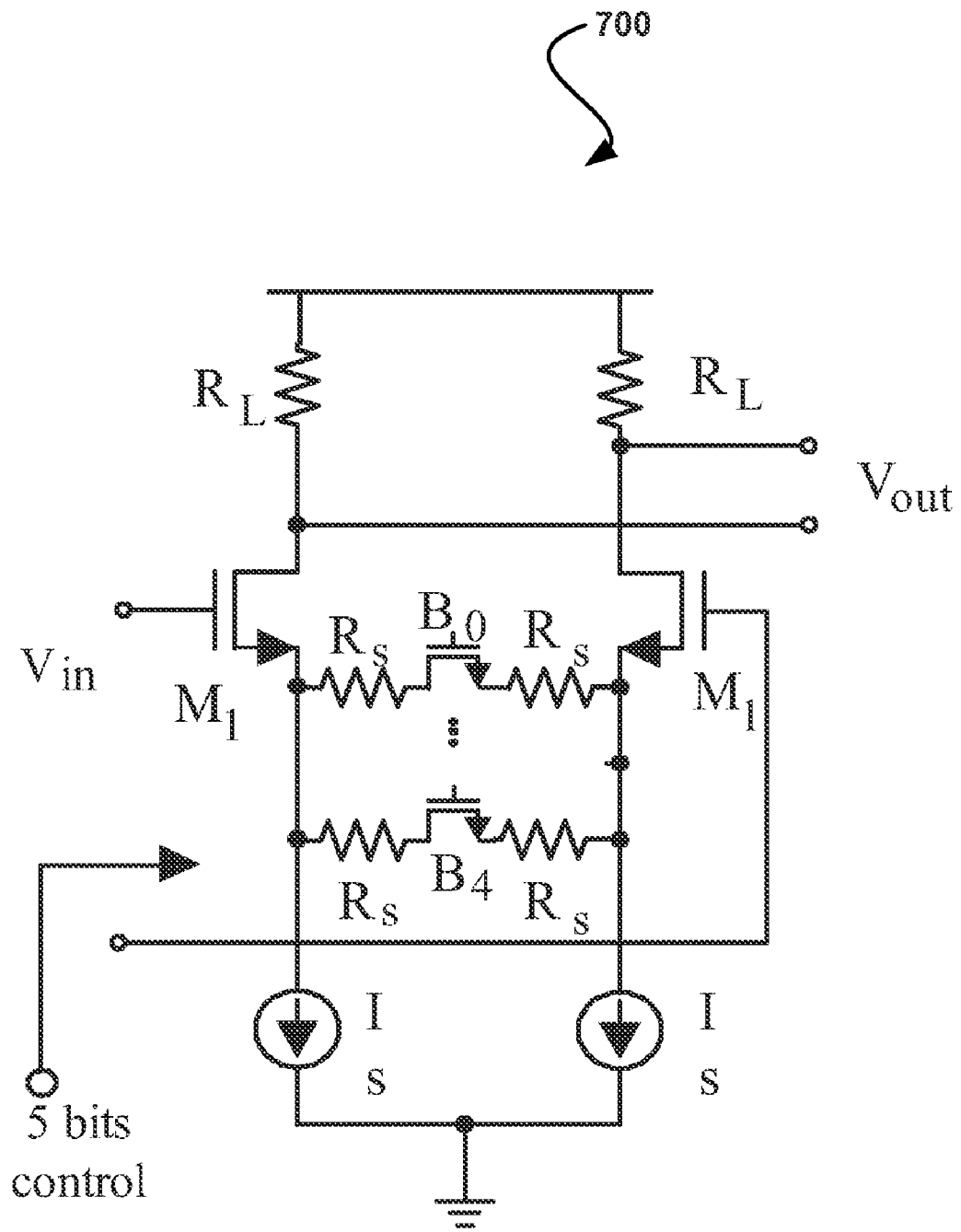
FIG. 7 shows a variable gain amplifier using source degeneration, in accordance with still yet another embodiment.

In one embodiment, the programmable gain element may include a variable resistor array. For example, the programmable gain element may include a variable gain amplifier using source degeneration, such as the variable gain amplifier 700 of FIG. 7. As shown in FIG. 7, a resistor value in a tail of a differential pair of the variable gain amplifier 700 may be changed according to output of a state machine of the adaptive bandwidth control logic 600, thereby allowing a gain to be varied.

Figure 8:
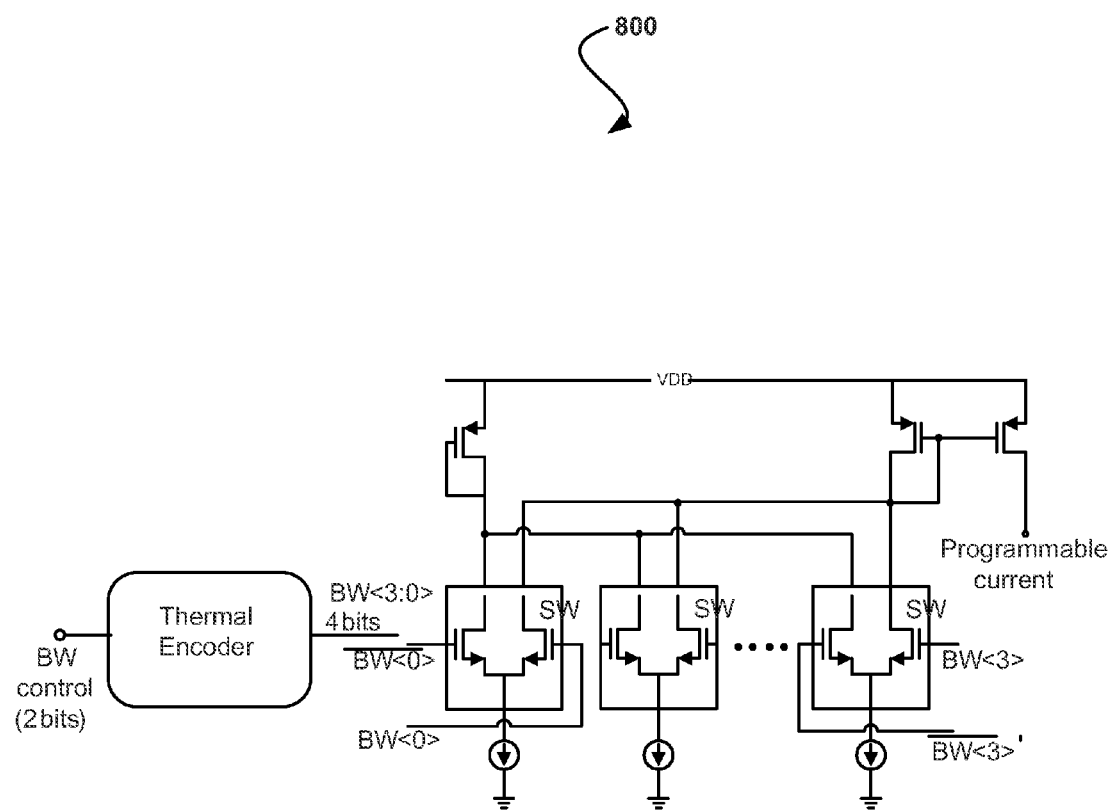
FIG. 8 shows a variable current source, in accordance with another embodiment.

In another embodiment, the programmable gain element may include a programmable current source array and gain block. Just by way of example, as shown in FIG. 8, the programmable current source array may be implemented as a digital-to-analog-converter (DAC) 800.

Figure 9:
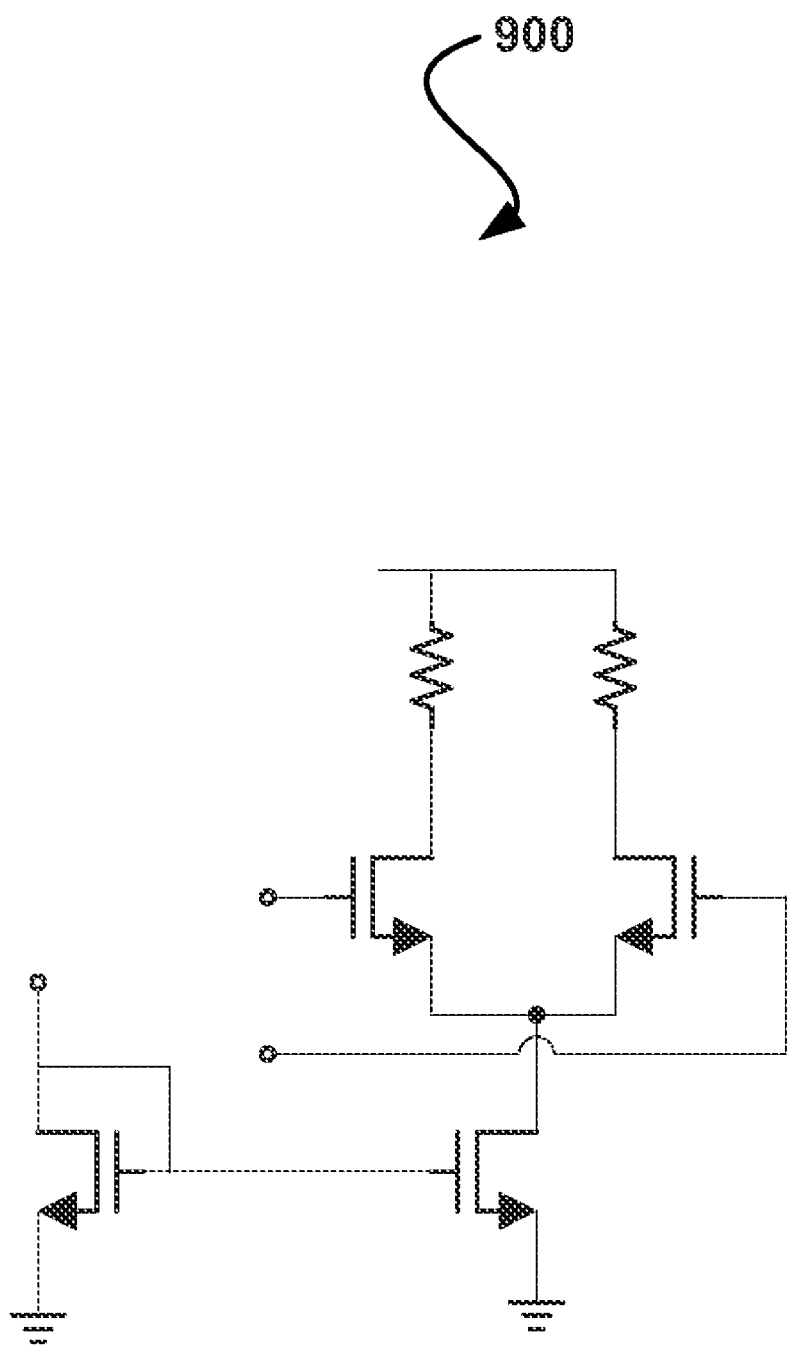
FIG. 9 shows an amplifier, in accordance with yet another embodiment.

The mirrored current output of the programmable current source array may be provided to a differential pair amplifier to change the gain setting (e.g. the bandwidth) of the clock and data recovery circuit. For example, as shown in FIG. 8, a thermal encoder may provide a four bit control to a current source array, such that the current may be varied without causing obvious glitches. Further, the output of the programmable current source array may be routed to a gain block to adjust (e.g. configure) the bandwidth (e.g. the current source). One example of such gain block may include the amplifier shown in FIG. 9. Of course, as another option, if the programmable current is not to be provided to other blocks (e.g. an integration path, etc.), then the programmable current source array and the gain block may be combined into a single cell.

Figure 10:
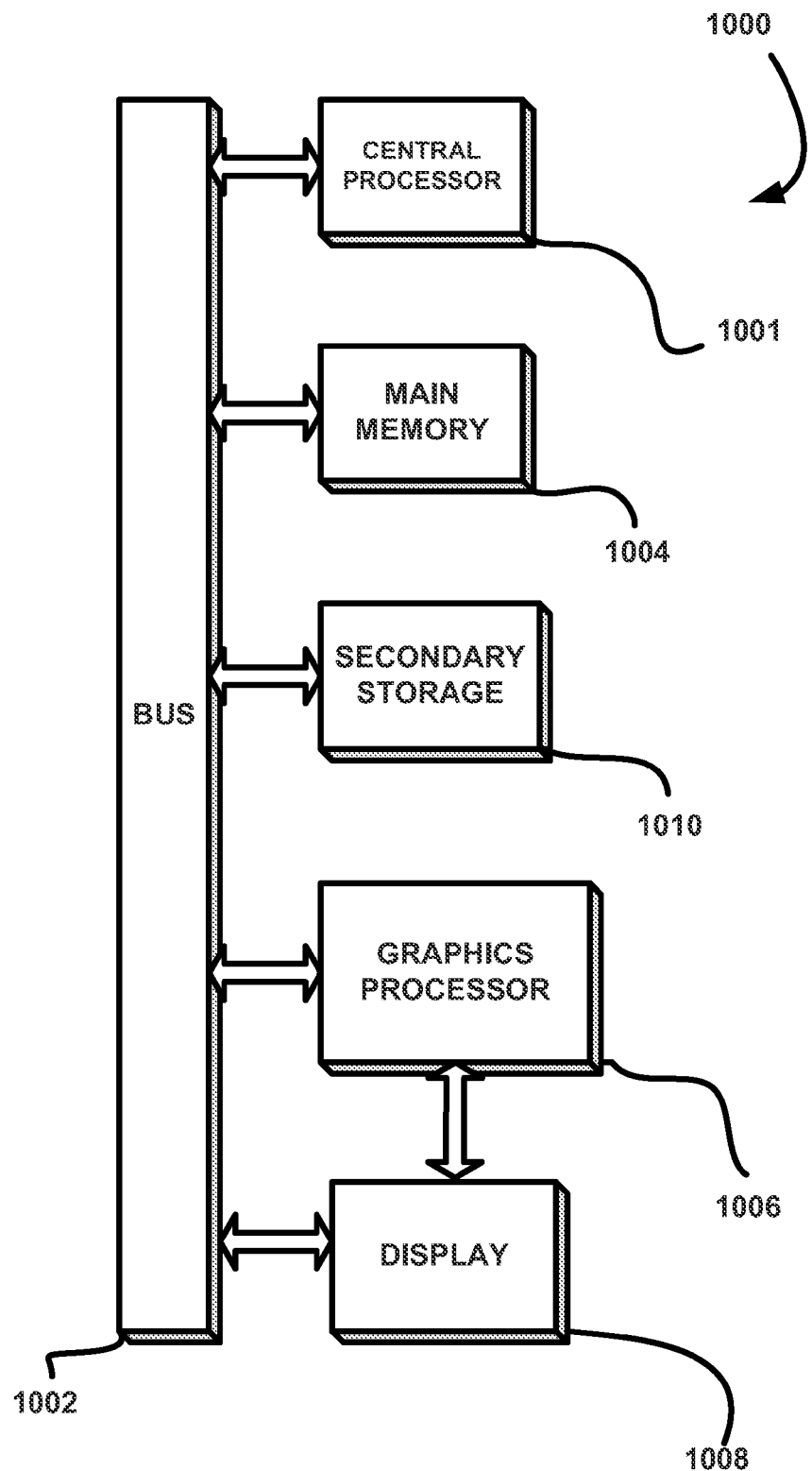
FIG. 10 shows an exemplary system in which the various architecture and/or functionality of the various previous embodiments may be implemented.

FIG. 10 illustrates an exemplary system 1000 in which the various architecture and/or functionality of the various previous embodiments may be implemented. As shown, a system 1000 is provided including at least one host processor 1001 which is connected to a communication bus 1002. The system 1000 also includes a main memory 1004. Control logic (software) and data are stored in the main memory 1004 which may take the form of random access memory (RAM).

The system 1000 also includes a graphics processor 1006 and a display 1008, i.e. a computer monitor. In one embodiment, the graphics processor 1006 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1000 may also include a secondary storage 1010. The secondary storage 1010 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 1004 and/or the secondary storage 1010. Such computer programs, when executed, enable the system 1000 to perform various functions. Memory 1004, storage 1010 and/or any other storage are possible examples of computer-readable media.

In one embodiment, the architecture and/or functionality of the various previous figures may be implemented in the context of the host processor 1001, graphics processor 1006, an integrated circuit (not shown) that is capable of at least a portion of the capabilities of both the host processor 1001 and the graphics processor 1006, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1000 may take the form of a desktop computer, lap-top computer, and/or any other type of logic. Still yet, the system 1000 may take the form of various other devices m including, but not limited to a personal digital assistant (PDA) device, a mobile phone device, a television, etc.

Further, while not shown, the system 1000 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A dock and data recovery circuit, comprising:
    a voltage controlled oscillator for outputting a phase of a clock;
    a phase detector for determining a phase difference between received data and the clock;
    a charge pump for outputting a current as a function of the phase difference, the current utilized for generating a control voltage provided to the voltage controlled oscillator; and
    an adaptive bandwidth control for providing the voltage controlled oscillator with an adaptive bandwidth based on the phase difference;
    wherein the adaptive bandwidth control utilizes a state machine for providing the adaptive bandwidth;
    wherein the state machine receives a first bit from the phase detector and outputs a second bit associated with a first clock cycle delay of the first bit and a third bit associated with a second clock cycle delay of the first bit.

2. The clock and data recovery circuit of claim 1, wherein the received data includes a digital data stream.

3. The clock and data recovery circuit of claim 1, wherein the adaptive bandwidth is provided by adjusting a bandwidth.

4. The clock and data recovery circuit of claim 3, wherein adjusting the bandwidth includes adjusting a step size of the bandwidth.

5. The clock and data recovery circuit of claim 4, wherein the step size is adjusted based on the phase difference.

6. The clock and data recovery circuit of claim 1, wherein the first bit from the phase detector indicates the phase difference.

7. The clock and data recovery circuit of claim 1, wherein the voltage controlled oscillator provides the phase of the clock to the phase detector for determining the phase difference.

8. The clock and data recovery circuit of claim 1, wherein the adaptive bandwidth control receives an indication of the phase difference from the phase detector.

9. The clock and data recovery circuit of claim 1, wherein the voltage controlled oscillator includes a ring oscillator.

10. The clock and data recovery circuit of claim 1, wherein the current is proportional to the phase difference and is integrated on a filtering capacitor for resulting in the control voltage.

11. The clock and data recovery circuit of claim 1, wherein the adaptive bandwidth control includes a bang-bang control.

12. The clock and data recovery circuit of claim 1, wherein the adaptive bandwidth control includes an integration control.

13. The clock and data recovery circuit of claim 1, wherein the adaptive bandwidth control provides the adaptive bandwidth by controlling an amplifier.

14. The clock and data recovery circuit of claim 13, wherein the amplifier includes a variable gain amplifier which uses source degeneration.

15. The clock and data recovery circuit of claim 1, wherein the adaptive bandwidth is provided for minimizing jitter associated with the received data.

16. The clock and data recovery circuit of claim 1, wherein the phase of the clock includes an adjusted phase of the clock.

17. The clock and data recovery circuit of claim 1, wherein the clock and data recovery circuit is implemented by a processor in communication with memory and a display via a bus.

18. A method executable by a clock and data recovery circuit, comprising:
    outputting a phase of a clock utilizing a voltage controlled oscillator;
    determining a phase difference between received data and the clock utilizing a phase detector;
    outputting a current as a function of the phase difference utilizing a charge pump, the current utilized for generating a control voltage provided to the voltage controlled oscillator; and
    providing the voltage controlled oscillator with an adaptive bandwidth based on the phase difference utilizing an adaptive bandwidth control;
    wherein the adaptive bandwidth control utilizes a state machine for providing the adaptive bandwidth;
    wherein the state machine receives a first bit from the phase detector and outputs a second bit associated with a first clock cycle delay of the first bit and a third bit associated with a second clock cycle delay of the first bit.

* * * * *